United States Patent
Breen et al.

(10) Patent No.: US 10,290,433 B2
(45) Date of Patent: May 14, 2019

(54) PLASTIC SOLAR DYE CELLS

(71) Applicant: 3GSOLAR PHOTOVOLTAICS LTD., Jerusalem (IL)

(72) Inventors: Barry Breen, Givat-Zeev (IL); Nir Stein, Tel-Aviv (IL); Ron Paz, Rehovot (IL); Jonathan Goldstein, Jerusalem (IL)

(73) Assignee: 3GSolar Photovoltaics Ltd, Jerusalem (IL)

( * ) Notice: Subject to any disclaimer, the term of this patent is extended or adjusted under 35 U.S.C. 154(b) by 0 days.

(21) Appl. No.: 14/904,953

(22) PCT Filed: Jul. 15, 2014

(86) PCT No.: PCT/IB2014/063131
§ 371 (c)(1),
(2) Date: Jan. 14, 2016

(87) PCT Pub. No.: WO2015/008227
PCT Pub. Date: Jan. 22, 2015

(65) Prior Publication Data
US 2016/0141113 A1 May 19, 2016

Related U.S. Application Data

(60) Provisional application No. 61/846,093, filed on Jul. 15, 2013.

(51) Int. Cl.
*H02N 6/00* (2006.01)
*H01L 31/042* (2014.01)
*H01L 21/00* (2006.01)
*H01G 9/20* (2006.01)
*H01G 9/00* (2006.01)
*H01L 51/00* (2006.01)

(52) U.S. Cl.
CPC ......... *H01G 9/2077* (2013.01); *H01G 9/0036* (2013.01); *H01G 9/2031* (2013.01); *H01G 9/2095* (2013.01); *H01G 9/2059* (2013.01); *H01L 51/003* (2013.01); *Y02E 10/542* (2013.01)

(58) Field of Classification Search
CPC .................................................... H01L 51/003
See application file for complete search history.

(56) References Cited

U.S. PATENT DOCUMENTS

2006/0219294 A1* 10/2006 Yabuuchi ............ H01G 9/2031
  136/263
2007/0209696 A1* 9/2007 Duerr .................. H01G 9/2031
  136/252

(Continued)

FOREIGN PATENT DOCUMENTS

EP 1589548 A1 10/2005
WO 2011009631 A1 1/2011

OTHER PUBLICATIONS

Durr et al., "Low-temperature fabrication of dye-sensitized solar cells by transfer of composite porous layers," Nature Materials 4, 607-611 (2005) (Year: 2005).*

(Continued)

*Primary Examiner* — Angelo Trivisonno
(74) *Attorney, Agent, or Firm* — Marc Van Dyke; Fourth Dimension IP

(57) ABSTRACT

Solar dye cells having a plastic housing, and methods of construction such solar dye cells.

20 Claims, 12 Drawing Sheets

(56) References Cited

U.S. PATENT DOCUMENTS

2008/0236662 A1* 10/2008 Ichikawa ............. H01G 9/2068
136/256
2011/0159628 A1* 6/2011 Shin ..................... H01G 9/2068
438/62
2012/0186644 A1 7/2012 Ko et al.

OTHER PUBLICATIONS

Durr M et al. "Low-temperature fabrication of dye-sensitized solar cells by transfer of composite porous layers", Nature Materials, Nature Publishing Group, GB, vol. 4 No. 8, Jul. 24, 2005 pp. 607-611.
International Search Report for PCT/IB2014/063131, search report—dated Oct. 22, 2014.
Written Opinion for PCT/IB2014/063131, written opinion—dated Oct. 22, 2014.

* cited by examiner

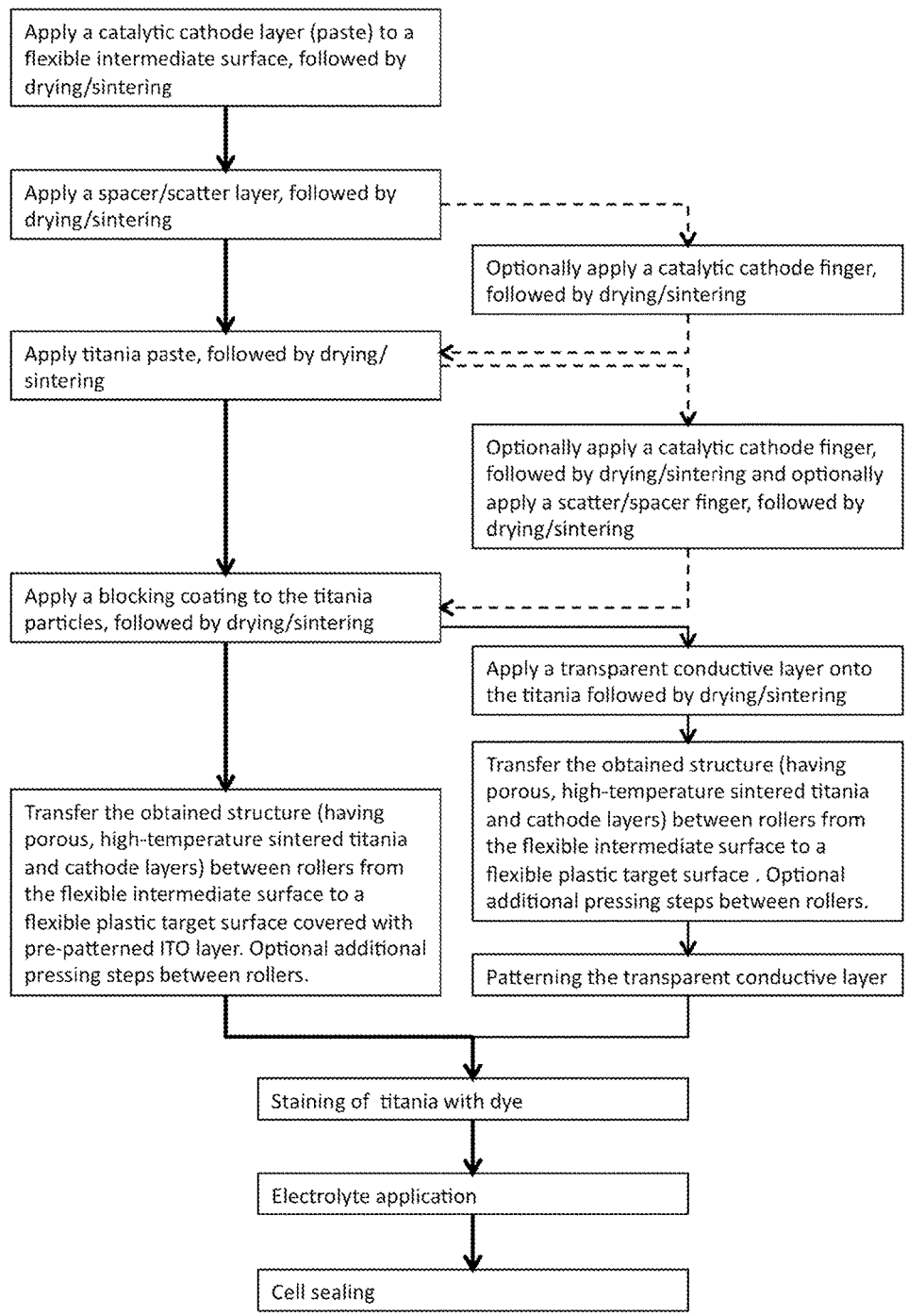

PLASTIC SOLAR DYE CELLS

This application draws priority from U.S. Provisional Patent Application Ser. No. 61/846,093, filed Jul. 15, 2013, which is hereby incorporated by reference, as if fully disclosed herein.

FIELD AND BACKGROUND OF THE INVENTION

The present invention relates to solar dye cells, and, more particularly, to solar dye cells having a plastic housing and methods of construction thereof.

SUMMARY OF THE INVENTION

According to some teachings of the present invention there is provided a photovoltaic dye cell arrangement including at least one photovoltaic dye cell, each having (a) a cell housing, the housing including an at least partially transparent cell wall along a first broad face of the housing; (b) an at least partially transparent electrically conductive layer disposed on a first interior surface of the cell wall, within the photovoltaic cell, the interior surface made of a plastic; (c) an anode disposed on the at least partially transparent electrically conductive layer, in distal fashion with respect to the first interior surface, the anode including: (i) a porous film surface disposed above, and electrically communicating with, a broad face of the electrically conductive layer, and adapted to make intimate contact with an electrolyte including a redox charge transfer species, the porous film including a plurality of nanoparticles and (ii) a dye, disposed on a surface of the porous film, the dye and the porous film adapted to convert photons to electrons, by means of the redox charge transfer species; and (d) a cathode disposed against a second interior surface on a second broad face of the housing, substantially opposite and above the anode, the cathode including a catalytic surface disposed to fluidly contact the electrolyte, the porous film being a sintered porous film containing high-temperature sintered titania.

According to another aspect of the present invention there is provided a method of producing a photovoltaic dye cell arrangement, the method including the steps of: (a) providing a flexible intermediate substrate; (b) applying, on the intermediate substrate, a layer of paste containing titania particles, to form a first structure; (c) subjecting the first structure to sintering at a temperature of at least 370° C. to produce a sintered structure including a sintered titania layer; (d) transferring the sintered structure to a flexible plastic substrate; and (e) fixedly adhering the sintered structure to the flexible plastic substrate.

According to yet another aspect of the present invention there is provided a method of producing a photovoltaic dye cell arrangement, the method including the steps of (a) providing a flexible intermediate substrate; (b) applying, on the intermediate substrate, at least one layer of paste selected from the group of pastes consisting of nanoparticulate titania paste, spacer layer paste, and cathodic paste, to form a first structure; (c) subjecting a dye cell structure including, or consisting of, the first structure, to sintering at a temperature of at least 370° C. to produce a sintered structure including a sintered titania layer; (d) subsequently, transferring the sintered structure to a flexible plastic substrate; and (e) fixedly adhering the sintered structure to the flexible plastic substrate.

According to yet another aspect of the present invention there is provided a photovoltaic dye cell arrangement including at least a first photovoltaic dye cell and a second photovoltaic dye cell, sharing a common, at least partially transparent cell wall forming a first broad face of a housing of the dye cell arrangement, each of the cells having (a) an at least partially transparent electrically conductive layer disposed on a first interior surface of the cell wall, within the photovoltaic cell, the interior surface made of a plastic; (b) an anode disposed on the at least partially transparent electrically conductive layer, in distal fashion with respect to the first interior surface, the anode including: (i) a porous film surface disposed above, and electrically communicating with, a broad face of the electrically conductive layer, and adapted to make intimate contact with an electrolyte including a charge transfer species, the porous film including a plurality of nanoparticles and (ii) a dye, disposed on a surface of the porous film, the dye and the porous film adapted to convert photons to electrons, by means of the charge transfer species; and (c) a cathode disposed against a second interior surface on a second broad face of the housing, substantially opposite and above the anode, the cathode including a catalytic surface disposed to fluidly contact the electrolyte, the porous film being a sintered porous film containing high-temperature sintered titania.

According to further features in the described preferred embodiments, the dye cell arrangement further includes the electrolyte, the electrolyte containing the redox charge transfer species.

According to still further features in the described preferred embodiments, the at least partially transparent electrically conductive layer includes a doped tin oxide layer.

According to still further features in the described preferred embodiments, the sintered porous film consists of, or consists largely, mostly, primarily, or essentially of, sintered titania.

According to still further features in the described preferred embodiments, the high-temperature sintered titania has structural properties of titania sintered at a temperature of at least 400° C., at least 425° C., at least 450° C., at least 475° C., at least 500° C., at least 525° C., at least 550° C., or at least 575° C.

According to still further features in the described preferred embodiments, the at least partially transparent electrically conductive layer includes a doped tin oxide.

According to still further features in the described preferred embodiments, the doped tin oxide includes indium oxide.

According to still further features in the described preferred embodiments, the cathode includes at least one type of conductive carbon.

According to still further features in the described preferred embodiments, the conductive carbon is selected from the group consisting of graphene, carbon nanotubes, carbon black, graphite, and fullerenes.

According to still further features in the described preferred embodiments, the second interior surface is made of plastic.

According to still further features in the described preferred embodiments, the first and second broad faces consist of, or consist largely, mostly, primarily, or essentially of, plastic.

According to still further features in the described preferred embodiments, the first and second broad faces consist of, or consist largely, mostly, primarily, or essentially of, at least partially transparent plastic.

According to still further features in the described preferred embodiments, the at least one dye cell includes a plurality of dye cells.

According to still further features in the described preferred embodiments, the cell housing contains the plurality of dye cells.

According to still further features in the described preferred embodiments, the at least partially transparent cell wall is a single, common at least partially transparent cell wall shared by the plurality of dye cells.

According to still further features in the described preferred embodiments, the plurality of dye cells is disposed in a side-by-side fashion along the at least partially transparent cell wall.

According to still further features in the described preferred embodiments, the plurality of dye cells electrically is connected in series by at least one intercell electrical connection.

According to still further features in the described preferred embodiments, the intercell electrical connection physically connects between the cathode of a first dye cell of the plurality of dye cells, and the anode of a second dye cell of the plurality of dye cells.

According to still further features in the described preferred embodiments, the intercell electrical connection has a different composition with respect to the at least partially transparent electrically conductive layer.

According to still further features in the described preferred embodiments, the intercell electrical connection has a different composition with respect to any component of the cathode.

According to still further features in the described preferred embodiments, the intercell electrical connection includes a material selected from the group consisting of silver, tungsten, and titanium nitride.

According to still further features in the described preferred embodiments, the intercell electrical connection is physically sealed from the electrolyte disposed within the dye cells.

According to still further features in the described preferred embodiments, the intercell electrical connection is physically sealed from the electrolyte disposed within the dye cells by a polymer sealant that largely, mostly, primarily, substantially, or completely radially envelops the intercell electrical connection.

According to still further features in the described preferred embodiments, the intercell electrical connection is physically sealed from the electrolyte disposed within the dye cells by a polymer sealant that largely, mostly, primarily, substantially, or completely envelops a length of the intercell electrical connection.

According to still further features in the described preferred embodiments, the intercell electrical connection is a discrete component with respect to components of the anode.

According to still further features in the described preferred embodiments, the intercell electrical connection is a discrete component with respect to components of the cathode.

According to still further features in the described preferred embodiments, the intercell electrical connection is an extension of, and/or integral with, the cathode.

According to still further features in the described preferred embodiments, the second broad face of the housing consists of, or consists largely, mostly, primarily, or essentially of, a polymer sealant.

According to still further features in the described preferred embodiments, the polymer sealant forms the second interior surface or the second broad face of the housing.

According to still further features in the described preferred embodiments, the cathode is devoid of, or substantially devoid of, a conductive tin oxide.

According to still further features in the described preferred embodiments, the cathode includes at least one type of conductive carbon, the polymer sealant contacting the conductive carbon.

According to still further features in the described preferred embodiments, the dye cells have a monolithic structure.

According to still further features in the described preferred embodiments, the cell wall is a flexible cell wall.

According to still further features in the described preferred embodiments, the flexible cell wall has sufficient flexibility to be used in a roll-to-roll transfer process.

According to still further features in the described preferred embodiments, the sintered structure arranged such that in either one of steps (e) provided above, the sintered titania layer is fixedly adhered directly to the flexible plastic substrate.

According to still further features in the described preferred embodiments, the fixedly adhering of the sintered structure includes at least one mechanical pressing operation.

According to still further features in the described preferred embodiments, the flexible intermediate carrier substrate consists largely, mostly, primarily, or essentially of a material selected from the group consisting of graphite, aluminum, stainless steel, and titanium.

According to still further features in the described preferred embodiments, a surface of the flexible intermediate carrier substrate consists largely, mostly, primarily, or essentially of a material selected from the group consisting of graphite, aluminum, stainless steel, and titanium.

According to still further features in the described preferred embodiments, the flexible intermediate carrier substrate is repeatably durable to the sintering.

According to still further features in the described preferred embodiments, the method further includes repeating the applying, subjecting and transferring [(either set of steps (b)-(d)] at least 2 times, at least 5 times, at least 20 times, at least 50 times, at least 200 times, or at least 1000 times, using a single, particular substrate of the flexible intermediate carrier substrate.

According to still further features in the described preferred embodiments, the sintering is effected at a temperature reaching at least 400° C., at least 425° C., at least 450° C., at least 475° C., at least 500° C., at least 525° C., at least 550° C., or at least 575° C.

According to still further features in the described preferred embodiments, the applying step includes a depositing or printing or screen-printing operation.

According to still further features in the described preferred embodiments, the method further includes staining the sintered titania layer with at least one dye, to produce a stained anode.

According to still further features in the described preferred embodiments, the method further includes assembling the stained anode, a catalytic cathode and an electrolyte containing a redox charge transfer species.

According to still further features in the described preferred embodiments, the method further includes sealing the stained anode, the catalytic cathode and the redox electrolyte to produce the photovoltaic dye cell.

According to still further features in the described preferred embodiments, the flexible plastic substrate has a transparent conductive layer, the transferring being performed so as to juxtapose the sintered titania layer against the transparent conductive layer.

According to still further features in the described preferred embodiments, the paste contains titania particles having an average particle size of less than 800 nanometers, less than 500 nanometers, less than 250 nanometers, less than 100 nanometers, less than 80 nanometers, less than 50 nanometers, less than 35 nanometers, less than 25 nanometers, or less than 20 nanometers.

According to still further features in the described preferred embodiments, the flexible intermediate substrate has an average thickness of less than 2000 µm, less than 1500 µm, less than 1000 µm, less than 800 µm, less than 600 µm, less than 400 µm, less than 300 µm, less than 250 µm, less than 200 µm, less than 150 µm, less than 125 µm, or less than 100 µm.

According to still further features in the described preferred embodiments, the method further includes, prior to either of steps (d) provided above, applying a cathodic layer on top of or above the sintered titania layer.

According to still further features in the described preferred embodiments, the method further includes, prior to either of steps (c) provided above, drying the layer of paste, and applying a titania scattering layer on top of [above] the titania particles.

According to still further features in the described preferred embodiments, the method further includes laying down an integral (unitary or self-supporting) cathode on top of [above] the titania scattering layer.

According to still further features in the described preferred embodiments, the cathode includes carbon particles.

According to still further features in the described preferred embodiments, the cathode includes a catalytic surface disposed in proximal and in generally opposite fashion with respect to an anodic surface within the dye cell.

According to still further features in the described preferred embodiments, the catalytic surface includes platinum.

According to still further features in the described preferred embodiments, at least one of steps (b) to (e) (from either set of steps provided above) is performed on a moving belt.

According to still further features in the described preferred embodiments, a roll of the flexible intermediate substrate is utilized in either of steps (a) provided above.

According to still further features in the described preferred embodiments, the method further includes rolling up an adhered sintered structure produced in either of steps (e) provided above, to form a roll of the photovoltaic dye cell arrangement.

According to still further features in the described preferred embodiments, the flexible plastic substrate being sufficiently flexible to be used in a roll-to-roll transfer process.

According to still further features in the described preferred embodiments, the flexible intermediate substrate being sufficiently flexible to be used in a roll-to-roll transfer process.

According to still further features in the described preferred embodiments, the fixedly adhering of the sintered structure to the flexible plastic substrate is performed between rollers.

According to still further features in the described preferred embodiments, the fixed adherence of the sintered structure to the flexible plastic substrate includes at least one mechanical pressing operation, the mechanical pressing operation including pressing between rollers.

According to still further features in the described preferred embodiments, the rollers are selected from the group consisting of metal rollers and plastic or polymeric rollers.

According to still further features in the described preferred embodiments, the metal rollers are steel rollers or stainless steel rollers.

According to still further features in the described preferred embodiments, the metal rollers are covered metal rollers.

According to still further features in the described preferred embodiments, the transferring of the sintered structure is performed between rollers.

According to still further features in the described preferred embodiments, the plurality of dye cells is electrically connected in series by at least one intercell electrical connection.

According to still further features in the described preferred embodiments, the intercell electrical connection physically connects between the cathode of a first dye cell of the plurality of dye cells, and the anode of a second dye cell of the plurality of dye cells.

According to still further features in the described preferred embodiments, the intercell electrical connection has a different composition with respect to the at least partially transparent electrically conductive layer.

According to still further features in the described preferred embodiments, the intercell electrical connection has a different composition with respect to any component of the cathode.

According to still further features in the described preferred embodiments, the intercell electrical connection includes a material selected from the group consisting of silver, tungsten, and titanium nitride.

According to still further features in the described preferred embodiments, the intercell electrical connection is physically sealed from the electrolyte disposed within the dye cells.

According to still further features in the described preferred embodiments, the intercell electrical connection is physically sealed from the electrolyte disposed within the dye cells by a polymer sealant that largely, mostly, primarily, substantially, or completely radially envelops the intercell electrical connection.

According to still further features in the described preferred embodiments, the intercell electrical connection is physically sealed from the electrolyte disposed within the dye cells by a polymer sealant that largely, mostly, primarily, substantially, or completely envelops a length of the intercell electrical connection.

According to still further features in the described preferred embodiments, the intercell electrical connection is a discrete component with respect to components of the anode.

According to still further features in the described preferred embodiments, the intercell electrical connection is a discrete component with respect to components of the cathode.

According to still further features in the described preferred embodiments, the intercell electrical connection being an extension of, and/or integral with, the cathode.

According to still further features in the described preferred embodiments, the intercell electrical connection includes, or consists substantially of, a bridging current collector.

According to still further features in the described preferred embodiments, the intercell electrical connection includes, or consists substantially of, at least one of a graphite foil and a metal mesh, or a combination thereof.

According to still further features in the described preferred embodiments, the bridging current collector is a physically distinct, laid-on bridging current collector.

According to still further features in the described preferred embodiments, the current collector is substantially S-shaped.

According to still further features in the described preferred embodiments, the bridging current collector makes electrical contact with an at least semi-transparent, electrically conducting layer disposed on the photoanodic side of the cell.

According to still further features in the described preferred embodiments, the bridging current collector makes electrical contact with an at least semi-transparent, electrically conducting layer via a conductive adhesive layer bridging between the current collector and the at least semi-transparent, electrically conducting layer.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. Throughout the drawings, like-referenced characters are used to designate like elements.

In the drawings:

FIG. 2A is a schematic block diagram of one aspect of the dye cell production method of the present invention, which includes a monolithic transfer step;

DESCRIPTION OF THE PREFERRED EMBODIMENTS

Figure 1:
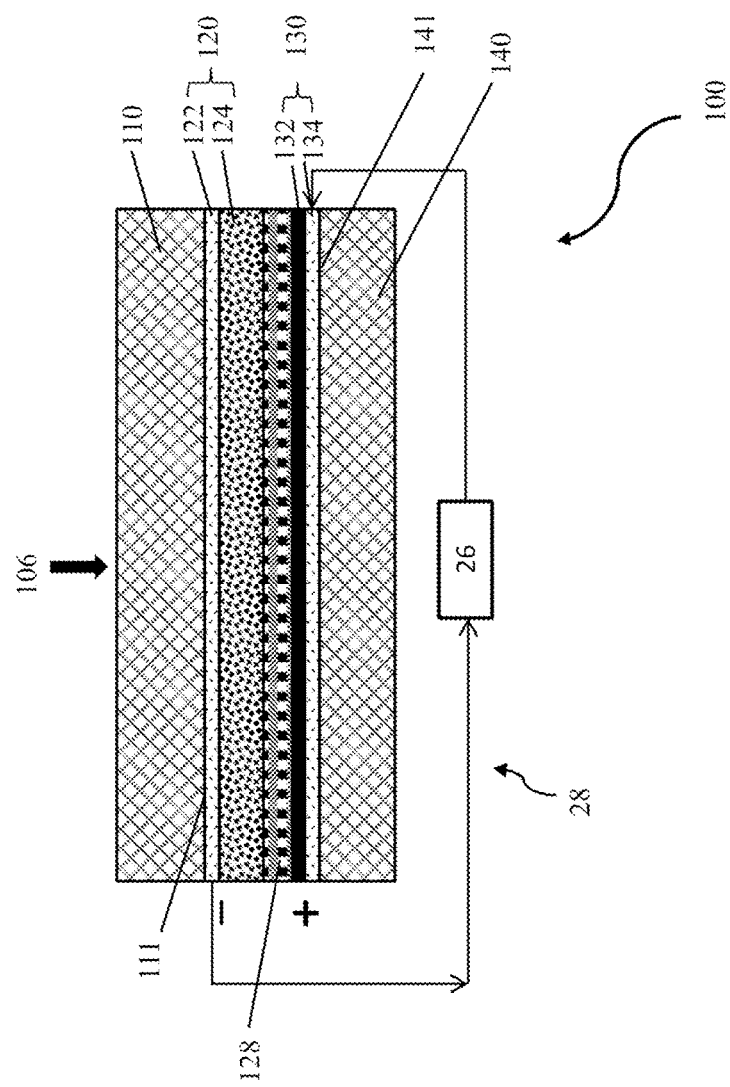
FIG. 1 provides a schematic, exemplary view of one aspect of a solar dye cell 100 of the present invention.

The principles and operation of the plastic solar dye cells according to the present invention may be better understood with reference to the drawings and the accompanying description.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Referring now to the drawings, FIG. 1 provides a schematic, exemplary view of one aspect of a solar dye cell 100 of the present invention. On an inside, plastic surface 111 of a first (anode-side) cell wall such as plastic cell wall 110 is disposed a thin (typically less than 800 nanometers), at least semi-transparent, electrically conducting layer 122. Conducting layer 122 may be a conducting oxide or tin oxide such as indium tin oxide (ITO). A sintered porous titania layer 124 is adheredly fixed to conducting layer 122. Sintered porous titania layer 124 has been sintered at a temperature of at least 370° C., and more typically, at 425° C. or higher, to achieve various structural properties that may vastly improve dye cell efficiencies. Plastic materials such as those used in plastic cell wall 110 are damaged or destroyed at such temperatures, and typically may be processed at temperatures well below 200° C., giving much reduced performance from the titania layer they support as compared high-temperature sintered titania. The inventive method for producing this inventive structure, in which the (high-temperature) sintered titania is adheredly fixed to an electrically conductive plastic substrate (including semi-transparent, electrically conducting layer 122 and plastic cell wall 110), is described hereinbelow.

Optionally, a titania scatter layer 128 may be juxtaposed to sintered titania layer 124, in distal fashion with respect to conducting layer 122. A titania blocking coating may be added by any conventional process. During operation of the cell, titania layer 124 has a dye adsorbed on the surface of the titania.

Conducting layer 122 and sintered titania layer 124 may be considered to be components of an anode 120. As shown, anode 120 is a photoanode facing a light source 106.

A cathode 130, which may advantageously include a catalytic layer such as catalytic carbon layer 132, is disposed opposite anode 120. Current take-off from cathode 130 may be facilitated by a thin, electrically conducting layer 134, which is disposed along a face of cathode 130, distal to anode 120. Conducting layer 134, which may be considered to be a portion of cathode 130, may be disposed adjacent to, or may be attached to, an inner surface 141 of a second (cathode-side) cell wall 140. Cell wall 140 may typically be a plastic cell wall. Cell walls 110 and 140 may be considered to be portions of a dye cell housing, which may serve to seal dye cell 100 from an environment such as an ambient environment.

During operation of the cell, an electrolyte is disposed within the cell, and is in contact with sintered porous titania layer 124 as well as with cathode 130.

At least one (and more typically, both) of plastic cell walls 110 and 140 is substantially transparent or at least semi-transparent. From the standpoint of dye cell efficiency, it is usually advantageous for sunlight to enter solar dye cell 100 via the anodic side, i.e., via plastic cell wall 110.

Device 100 may supply power to a load 26 in an external circuit 28, as shown.

It will be appreciated that the dye solar cells of the present invention, and the methods of producing these cells, are not limited in its application to the details of construction and the arrangement of the components set forth in the following description or illustrated in the drawings. The inventions are capable of other embodiments or of being practiced or carried out in various ways. Also, it is to be understood that the phraseology and terminology employed herein is for the purpose of description and should not be regarded as limiting.

FIG. 2A is a schematic block diagram of one aspect of the dye cell production method of the present invention, which includes a monolithic transfer step or method. In this dye cell production method, a catalytic cathode layer is applied to a flexible intermediate substrate surface. The catalytic activity may be provided by various forms of carbon, including, but not limited to, carbon nanotubes, by platinum particles, or by any other materials known to those of skill in the art. A drying and/or sintering step may then be effected. The requisite and desired features of such flexible substrates and surfaces are described hereinbelow, and several exemplary substrates are provided. A spacer and/or scatter layer paste may be applied on top of the cathode layer. The spacer layer may be applied by a printing process such as screen-printing, the printing followed by drying and/or sintering.

The nanoparticulate titania paste may then be applied, again followed by a drying and/or sintering step. More than one layer of the titania paste may be applied. The titania particles in the paste may be nanoparticulate, having an average particle size below 200 nm, and more typically, below or well below 100 nm, as will be appreciated by those of ordinary skill in the art.

The nanoparticulate titania may then be coated with a blocking coating; this may be effected by any of various conventional processes, e.g., dip coating in a titanium chloride solution; electrophoretic deposition; or screen printing using a titania precursor. This coating process may be followed by drying and/or sintering.

While more than one sintering step may have been conducted up until this point, it is imperative that in one, or at least one, of these sintering steps, the nanoparticulate titania undergoes high-temperature sintering. As used herein in the specification and in the claims section that follows, the term "high-temperature sintered", "undergone high-temperature sintering", and the like, with respect to a cell component or material, refers to the structural features of a component that has been heated to at least 370° C., to achieve distinct structural features in the cell component. Typically, this sintering may be conducted at a temperature of at least 400° C., at least 425° C., at least 435° C., at least 450° C., at least 480° C., at least 500° C., at least 520° C., or at least 550° C. to achieve further advantageous structural features in the cell component. Specifically with regard to sintered titania, the structure of titania heated above 370° C. and preferably higher (e.g., 450° C. to 550° C.), is modified to enable higher-efficiency cells. Without wishing to be bound by theory, the inventors believe that the sintering produces inter-particle necking that improves charge-carrier transport through the porous titania matrix.

We have discovered that the obtained dye cell structure, including the porous, high-temperature sintered titania layer and one or more cathode layers, may be transferred from the flexible intermediate surface to a flexible target surface, such as the surface of a flexible plastic substrate (typically being at least partially transparent or substantially transparent). The sintered conductive catalytic cathode layer may be substantially peeled off from the flexible intermediate substrate and along with the ultra-thin (typically less than 15 micrometers) sintered porous layer of nanoparticulate titania 124, transferred (e.g., between rollers), in a monolithic fashion, to a flexible plastic target surface, optionally covered with a (pre-patterned) transparent conductive layer.

We have found that this transfer may be complete or substantially complete, without disintegration and/or deterioration of the layers, including the ultra-thin (typically less than 15 micrometers), sintered porous layer of nanoparticulate titania 124.

We have found that many common flexible supports such as copper metal, nickel metal and some carbon steels:

may tend to bond too strongly to the titania layer, thereby impeding adequate transfer of layers; and/or may not be sufficiently inert, from a chemical standpoint, to reliably and repeatably withstand sintering conditions, and/or to remain substantially uncontaminated during processing.

Exemplary flexible intermediate surfaces utilized in the inventive method include foils made of aluminum, stainless steel, titanium, and graphite. Such foils are characterized by their ability to withstand the sintering conditions, which include temperatures of at least 370° C., and typically reach 450° C. to 550° C. In addition, the flexible intermediate surface should have good resistance to air, moisture and titania precursor decomposition products at the elevated temperatures. These flexible intermediate surfaces may be as smooth as ordinary graphite foils, and may be appreciably smoother.

With reference again to FIG. 2A, a flexible plastic substrate having a conductive surface layer, e.g., an indium tin oxide (ITO) layer that is at least partially transparent is laid on the anodic side of the dye cell structure. This structure is then fixedly transferred to the flexible plastic substrate. The process may advantageously be effected by means of rollers in a continuous or semi-continuous process, described in greater detail hereinbelow.

We have discovered that the efficacy of the transfer of electrons from the sintered titania layer to the conductive tin oxide layer may be appreciably improved by fixedly adhering the layer to the plastic substrate, e.g., by mechanical pressing. We have further discovered that one or more of such mechanical pressing steps, typically after the transfer from the intermediate substrate, may sufficiently adhere the porous sintered titania layer to the plastic substrate, without deleterious side-effects such as partial disintegration of this layer, or other layers within the dye cell structure.

For multiple dye cell constructions, the at least partially transparent conductive layer may be a pre-patterned layer such as an ITO layer.

In the inventive process, optional additional pressing steps (e.g., between rollers) may be effected.

To complete the solar dye cell, dye is applied to the porous titania layer, electrolyte is introduced to the cell (e.g., by printing), and the cell is sealed from the environment and/or from any adjacent cells, using any of various sealants known in the art. It will be appreciated that these steps, known to those of ordinary skill in the art, may be conducted at various points within the dye cell fabrication methods of the present invention.

It should be emphasized that the catalytic cathode layer may be sufficiently conductive, thick, and continuous, to enable efficient current take-off from one cell to the ITO of the next cell.

Polyethylene terephthalate (PET), better characterized by poly(ethylene terephthalate), and polyethylene naphthalate (PEN), better characterized by poly(ethylene 2,6-naphthalate), are exemplary plastic materials that may be suitable for use as flexible plastic substrates in the dye cells and dye cell production methods of the present invention.

These materials may be generally suitable for low-temperature sintering methods of titania and carbon layers at temperatures around 200° C. or less. Using the inventive production methods, however, these materials may be advantageously affixed to high-temperature sintered titania, obviating the need for using substrates having high-temperature stability (such as glass), and, as will be described in greater detail below, enabling fast, efficient, and inexpensive construction of multiple dye cell constructions. It must be emphasized that the use of flexible intermediate and target substrates makes it especially appropriate to utilize roll-to-roll cell manufacturing methods to produce the inventive dye cell.

Various optional steps are also provided in FIG. 2A. For example, in the case of multiple dye cell constructions, a catalytic cathode appendage, or elongated section, may be applied, separately from the catalytic cathode layer, followed by drying and/or sintering. Similarly, a scatter layer or spacer layer appendage may be applied, followed by drying and/or sintering.

Also, as an alternative to using a plastic substrate having a transparent conductive layer to complete the anodic side of the cell, an at-least semi-transparent conductive layer such as FTO may be applied on the porous titania layer. After drying and/or sintering, a flexible plastic substrate (e.g., regular PET, without a conductive layer) may be laid on the anodic side of the dye cell structure. This structure is then fixedly transferred to the flexible plastic substrate. The process may advantageously be effected by means of rollers in a continuous or semi-continuous process, described in greater detail hereinbelow.

Patterning of this transparent conductive layer may be performed, to produce discontinuities in the conductive layer, discontinuities which may essentially divide the arrangement into multiple dye cells.

Figure 2B:
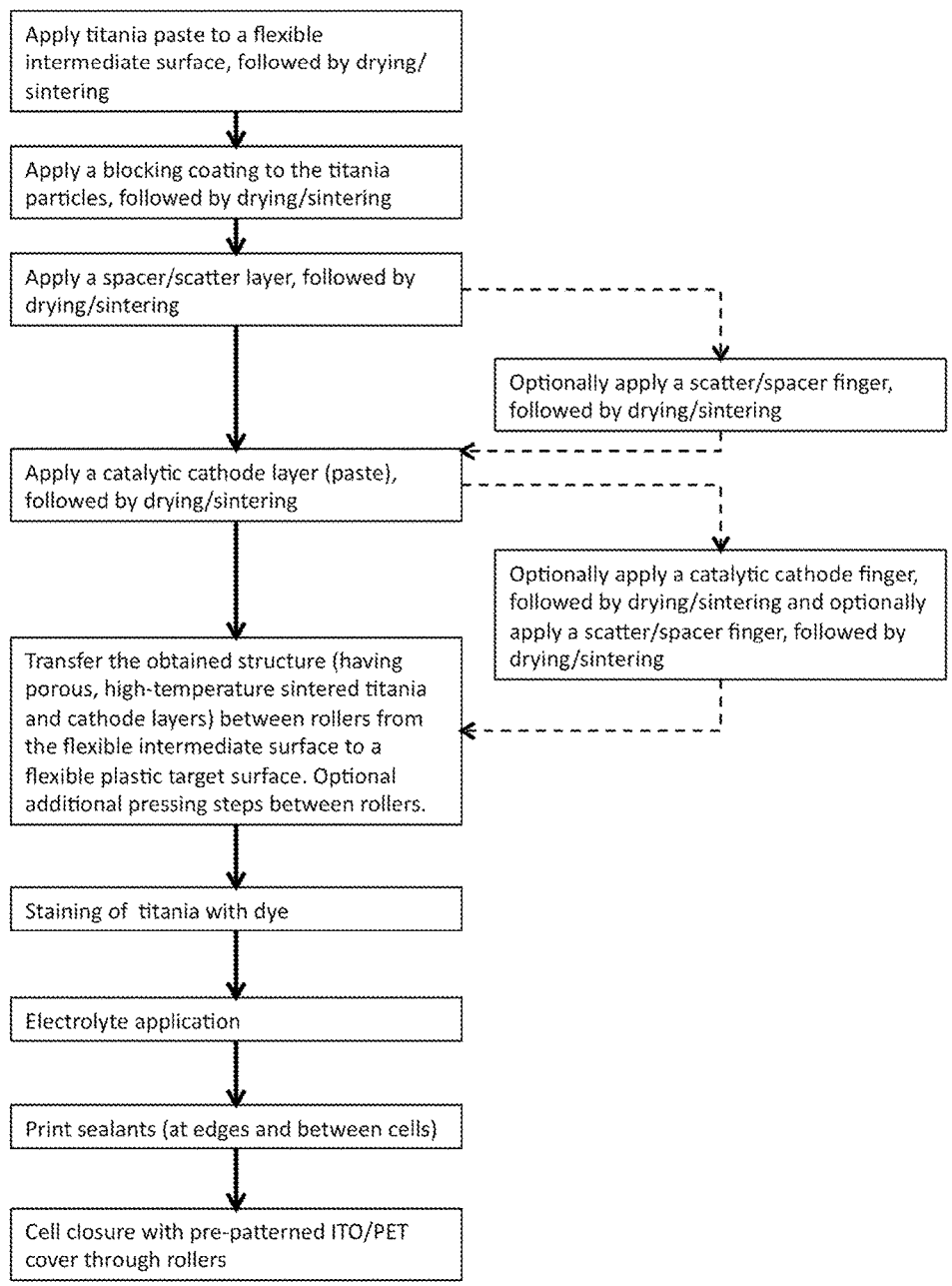
FIG. 2B is a schematic block diagram of another aspect of the dye cell production method of the present invention, which includes a reverse monolithic transfer step.

FIG. 2B is a schematic block diagram of another aspect of the dye cell production method of the present invention, which includes a reverse monolithic transfer step or method. In this dye cell production method, a nanoparticulate titania paste may be applied to a flexible intermediate substrate (or "carrier") surface, followed by a drying and/or sintering step. More than one layer of the titania paste may be applied. As described hereinabove, the titania particles in the paste may be nanoparticulate, having an average particle size below 100 nm.

Optionally, the nanoparticulate titania may then be coated with a blocking coating; this may be effected by any of various above-described conventional processes, The coating step may be followed by drying and/or sintering.

A spacer and/or scatter layer paste may then be applied to the nanoparticulate titania layer, followed by drying and/or sintering. The spacer layer may be applied by a printing process such as screen-printing.

A catalytic cathode layer may then applied to the spacer layer followed by drying and/or sintering steps. As described hereinabove, the catalytic activity may be provided by various forms of carbon, including, but not limited to, carbon nanotubes, by platinum particles, or by any other materials known to those of skill in the art.

The dye cell structure may then be fixedly transferred to a flexible plastic substrate, such that the cathodic side of the structure is juxtaposed against this substrate. The process may advantageously be effected by means of rollers in a continuous or semi-continuous process, described in greater detail hereinbelow. We have discovered that one or more mechanical pressing steps, typically after the transfer from the intermediate substrate, may sufficiently adhere the cathode/catalytic cathode layer to the plastic substrate.

In this method and structure, the flexible plastic substrate does not need to have an at least partially transparent conductive surface layer (e.g., an ITO layer).

To complete the solar dye cell, dye is applied to the porous titania layer, and the cell is sealed at the edges (and from any adjacent cells), using any of various sealants known in the art. It will be appreciated that these steps, known to those of ordinary skill in the art, may be conducted at various points within the dye cell fabrication methods of the present invention.

The anodic side of the cell may then be covered, preferably by a cover having an at least semi-transparent conductive layer that may be juxtaposed against the porous titania layer. Typically, cell closure is achieved using a plastic (e.g., PET) cover having an ITO (or equivalent) conductive layer. The process may advantageously be effected by means of rollers in a continuous or semi-continuous process, described in greater detail hereinbelow.

The introduction of electrolyte into the cell may typically be effected after cell closure.

In the case of multiple cell constructions, the conductive layer may be pre-patterned, as described herein.

Various optional steps are also provided in FIG. 2B. For example, in the case of multiple dye cell constructions, a catalytic cathode appendage may be applied, separately from the catalytic cathode layer, followed by drying and/or sintering. Similarly, a scatter layer or spacer layer appendage may be applied, followed by drying and/or sintering.

Figure 2C:
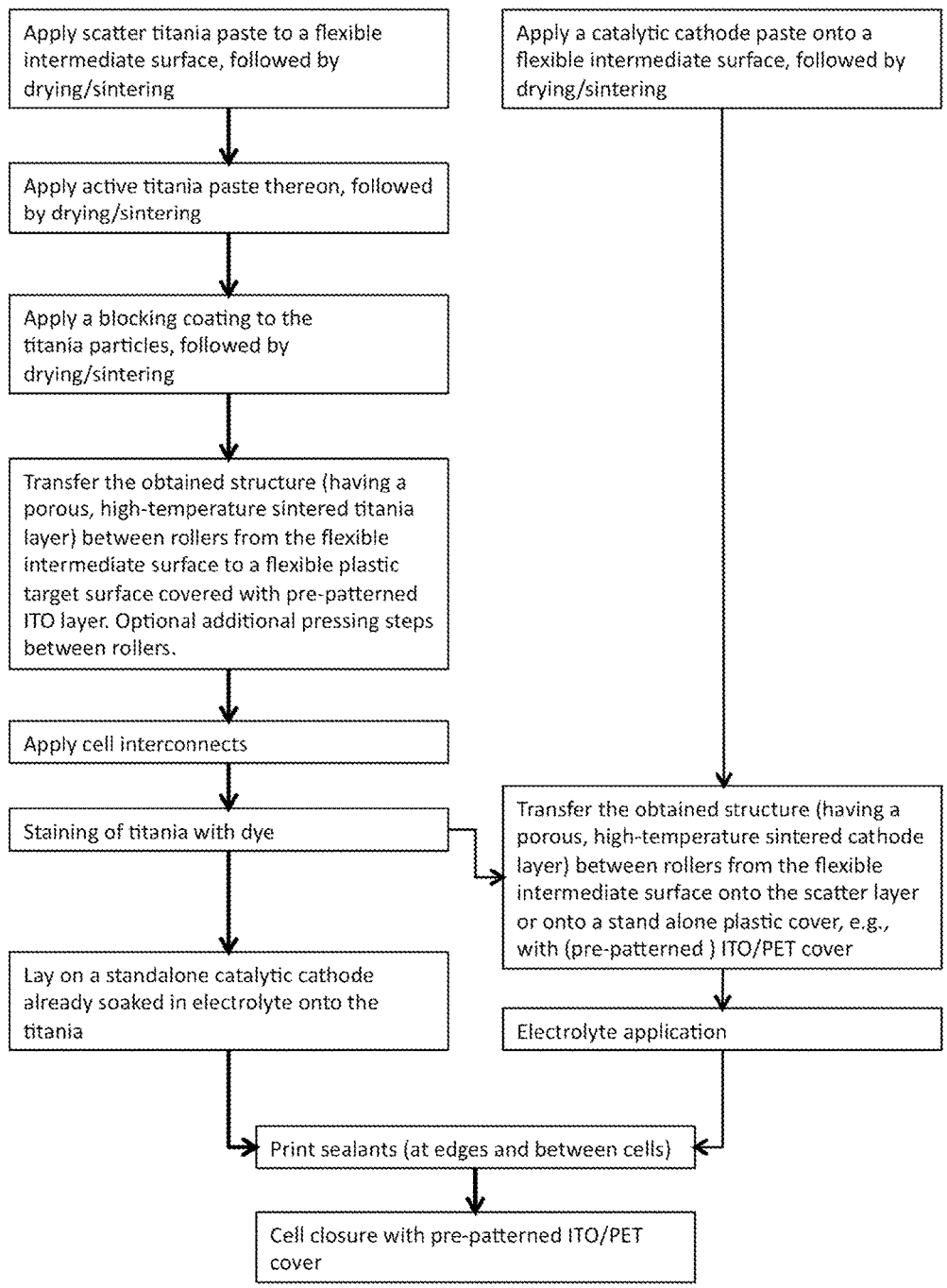
FIG. 2C is a schematic block diagram of another aspect of the dye cell production method of the present invention, which involves an anodic transfer step combined with a laid-on or transferred cathode step.

FIG. 2C is a schematic block diagram of another aspect of the dye cell production method of the present invention that involves an anodic transfer step combined with a laid-on or transferred cathode step. In this dye cell production method, a spacer and/or scatter layer paste may be applied to a flexible intermediate substrate surface, followed by a drying and/or sintering step. The spacer layer may be applied by a printing process such as screenprinting.

A layer of nanoparticulate titania paste may be applied to the spacer and/or scatter layer, followed by a drying and/or sintering step. More than one layer of the titania paste may be applied. As described hereinabove, the titania particles in the paste may be nanoparticulate, having an average particle size well below 100 nm.

Optionally, the nanoparticulate titania may then be coated with a blocking coating, followed by drying and/or sintering, substantially as described hereinabove.

Unlike the methods shown in FIGS. 2A and 2B, however, the dye cell structure having the porous, high-temperature sintered titania layer is transferred from the flexible intermediate surface to the flexible target substrate (typically a plastic substrate having a transparent conductive surface layer, as described), before the cathode is integrated into the dye cell structure.

After transferring the sintered structure to the plastic substrate, at least one additional mechanical pressing step may be optionally performed to fixedly adhere the porous sintered titania layer to the plastic substrate. These operations may advantageously be performed between rollers.

In the case of multiple-cell constructions, cell interconnects (such as structural conductive element 325, shown in FIG. 3 and described hereinbelow) may be applied or affixed.

Dye may be applied to the porous titania layer. A cathode (typically a standalone, laid-on, integral structural component), which may be pre-soaked in electrolyte, may be laid on to the dye cell structure on the side previously covered by the flexible intermediate substrate.

Alternatively, a catalytic cathode paste may be applied onto a second flexible intermediate surface, followed by drying/sintering, The obtained structure (having a porous, high-temperature sintered cathode layer) may be transferred, typically between rollers, from the flexible intermediate surface onto the titania layer or onto a standalone plastic cover (e.g., a pre-patterned ITO/PET cover).

The dye cell may then be closed by a flexible plastic substrate, which may have an at least partially transparent conductive surface layer (e.g., an ITO layer). This plastic substrate may be laid onto the cathodic side of the dye cell structure.

After applying the electrolyte, the cell may be sealed at the edges, and from any adjacent cells, and the cell may then be closed by a flexible plastic substrate having an at least transparent conductive layer, as described.

Figure 2D:
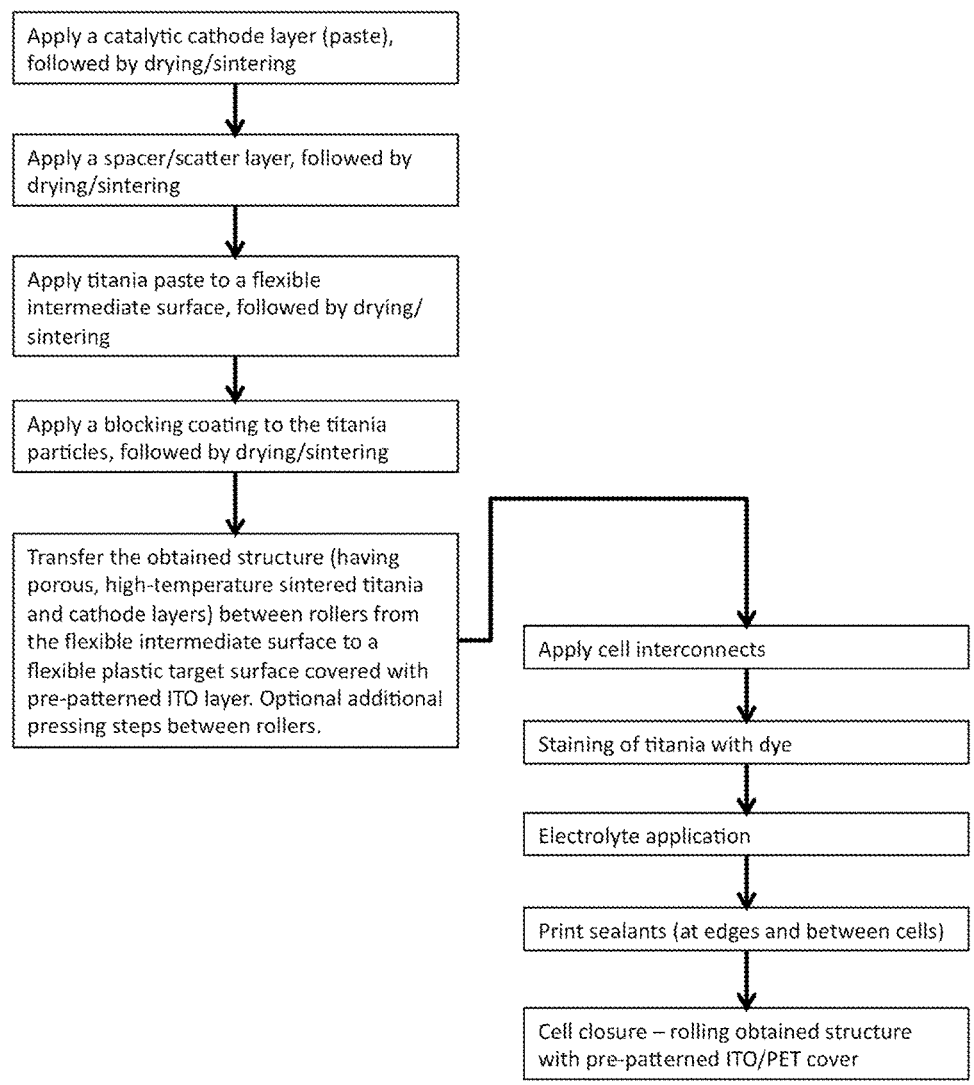
FIG. 2D is a schematic block diagram of another aspect of the dye cell production method of the present invention, similar to the method of FIG. 2A, but including an anode transfer step combined with a cathode transfer step and optional interconnects to adjacent cells.

FIG. 2D is a schematic block diagram of another aspect of the dye cell production method of the present invention including an anode transfer step combined with a cathode transfer step, which may be referred to as an anode plus cathode transfer.

The initial steps of this method may be identical or substantially similar to those of the method shown in FIG. 2A. However, as shown in FIG. 2D, the cathodic side of the cell may be covered, preferably by a cover having an at least semi-transparent conductive layer that may be juxtaposed against the cathode layer. Typically, cell closure is achieved using a plastic (e.g., PET) cover having an ITO (or equivalent) conductive layer. The process may advantageously be effected by means of rollers.

It will be appreciated by those of ordinary skill in the art that the methods associated with FIGS. 2A-2D are fundamentally suitable for producing both single cells and series-connected multiple cell configurations or modules.

Figure 2E:
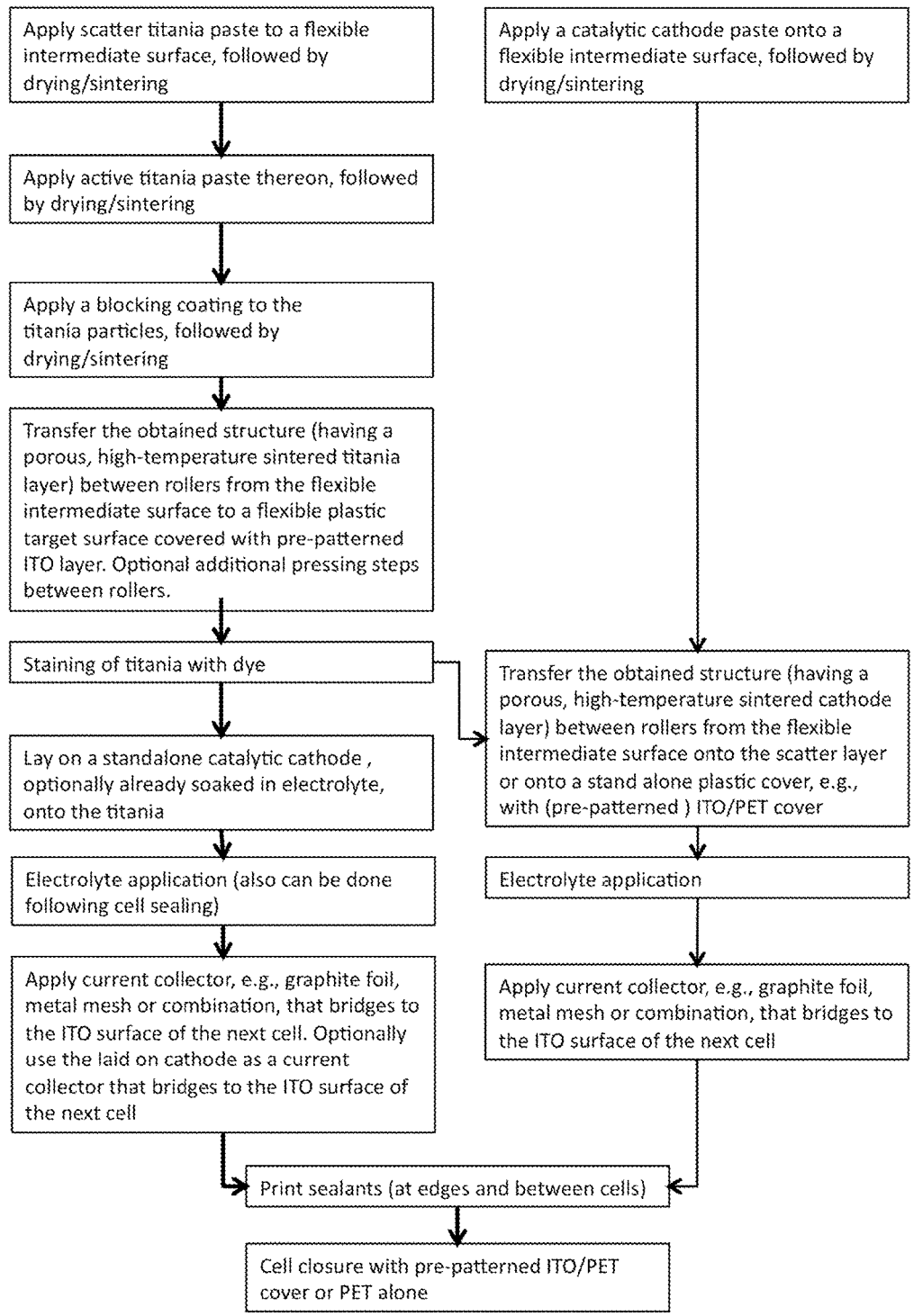
FIG. 2E is a schematic block diagram of another aspect of the inventive dye cell production method, similar to the method of FIG. 2A, but including the laying-on of a bridging cathodic current collector that, while being electrically isolated from the photoanode, is electrically connected to an indium tin oxide (ITO) layer disposed on the photoanodic side of the cell.

FIG. 2E is a schematic block diagram of another aspect of the inventive dye cell production method, the method including the laying-on of a bridging cathodic current collector that, while being electrically isolated from the photoanode, is electrically connected to an at least semi-transparent, electrically conducting layer 122 (e.g., an ITO layer) disposed on the photoanodic side of the cell.

Figure 2F:
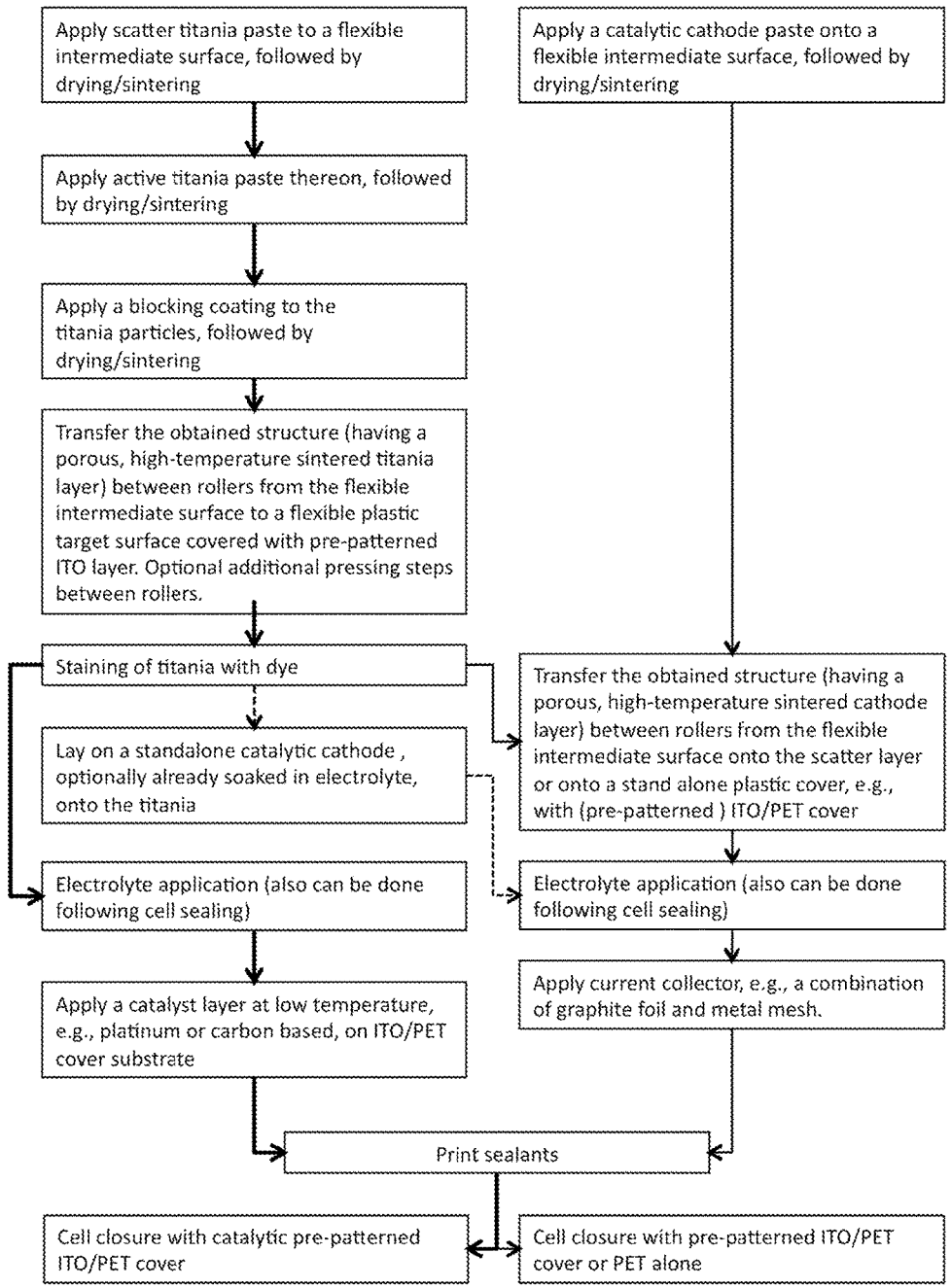
FIG. 2F is a schematic block diagram of another aspect of the inventive dye cell production method, similar to the methods of FIGS. 2C and 2E, but for a single dye cell wherein the laid-on bridging cathodic current collector is electrically isolated from the photoanode, but may be electrically connected to an indium tin oxide (ITO) layer disposed on the photoanodic side of the cell.

FIG. 2F is a schematic block diagram of an inventive dye cell production method, similar to the method of FIG. 2E, but for single dye cells. A cathodic current collector, which may be a laid-on cathodic current collector, is electrically isolated from the photoanode, but may be electrically connected to an indium tin oxide (ITO) layer disposed on the photoanodic side of the cell. Optionally, the cathode may include a platinum catalyst on an ITO layer disposed on a PET wall or substrate.

The method of FIG. 2E may be referred to as a quasi-monolithic transfer method, and is fundamentally suitable for producing both single cells and series-connected multiple cell configurations or modules. The initial steps of the quasi-monolithic transfer method may be identical or substantially similar to those of the methods shown in FIGS. 2A-2D. However, with reference now to FIG. 5, the catalytic cathode component 532 of the dye cell 500 is contacted by a bridging current collector such as laid-on bridging current collector 534 that may have, or be formed into, an S-shape (substantially as shown) so as to make electrical contact with an at least semi-transparent, electrically conducting layer such as ITO layer 522A disposed on the photoanodic side of cell 500. Any cavity within cell 500, such as cavity 551, may be filled with electrolyte.

In some embodiments, cell 500 may be part of a multiple cell arrangement, in which case, electrically conducting layer 522A may be shared by a photoanode of an adjoining cell, which may be electrically connected to cell 500 via an extra-cellular portion 523A of electrically conducting layer 522A. Alternatively or additionally, electrically conducting layer 522 of anode 520 of cell 500 may be shared by a cathode of a different adjoining cell, which may be electrically connected to cell 500 via an extra-cellular portion 523 of electrically conducting layer 522.

Conducting layer 522 and conducting layer 522A may each be substantially continuous (e.g., ITO coatings on the plastic cell wall), with a small electrically insulating break separating therebetween.

Bridging current collector 534 may include a graphite foil or a metal mesh, or a combination thereof. Advantageously, bridging current collector 534 may be bonded in place onto a surface of electrically conducting layer 522A by means of an electrically conducting layer or electrically conducting adhesive layer 535, which may be chemically inert or substantially chemically inert with respect to the components within cell 500.

Conducting adhesive layer 535 may advantageously have a low curing temperature. Exemplary inert conducting materials disposed within conducting adhesive layer 535 may include adhesive materials containing conducting structures including tungsten or titanium metal or alloys, and/or titanium nitride (or other conductive nitrides), and/or conductive carbon such as carbon nanotubes. Many of the above-mentioned materials may reduce the risk of damage due to corrosion within the cell. Adhesive materials suitable for conducting adhesive layer 535 may include various silicones and epoxies.

Figure 5:
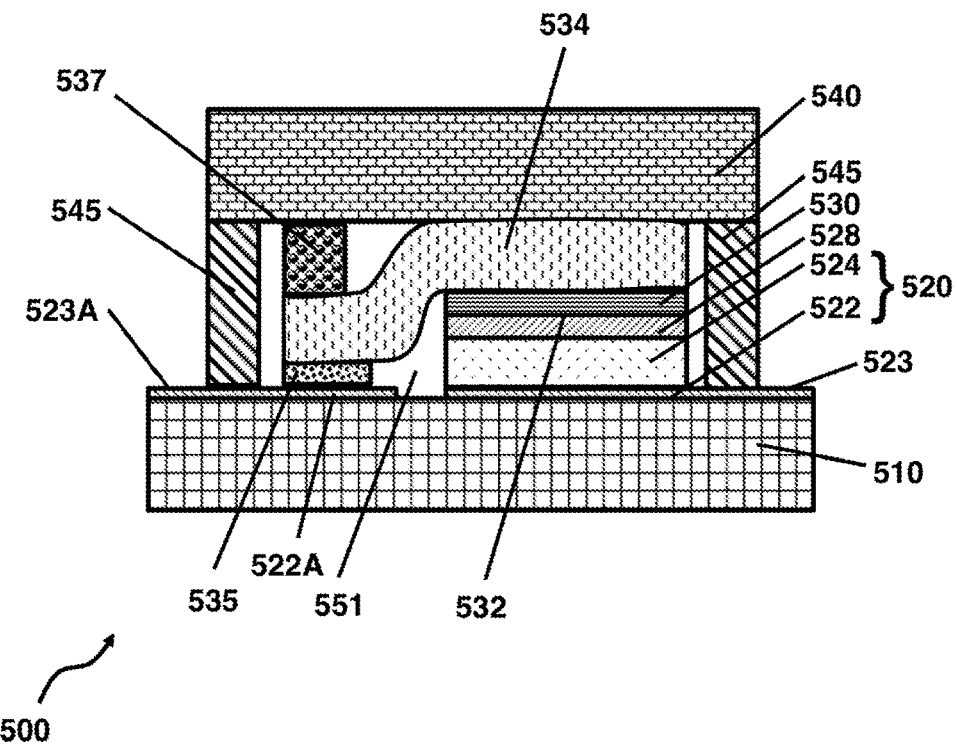
FIG. 5 provides a schematic view of an exemplary single dye cell arrangement in which the catalytic cathode and the anode may be electrically connected in a co-planar fashion on a single layer of ITO.

In the exemplary embodiment provided in FIG. 5, a first (anode-side) cell wall 510 includes, or is made of, a plastic or polymeric material such as PET or PEN. Similarly, a second (cathode-side) cell wall 540 includes, or is made of, a plastic or polymeric material such as PET or PEN. Cell walls 510 and 540 may serve as the cell walls for at least two dye cells, and more typically, for a large plurality of such cells.

In some embodiments, a rigid or semi-rigid spacer element such as polymeric spacer element 537 may be disposed between cell wall 540 and laid-on bridging current collector 534. Cell wall 540 and/or cell wall 510 may be adapted such that a pressure is exerted between cell wall 540 and a rigid or semi-rigid polymeric spacer 537. Such an arrangement may further secure and electrically connect bridging current collector 534 to electrically conducting layer 522 via electrically conducting adhesive layer 535.

Dye cell 500 includes a porous semiconductor (typically titania) layer such as sintered porous titania layer 524, which may be disposed above transparent conducting layer 522, and electrically communicating therewith, together forming an anode 520. Dye cell 500 also includes a cathode 530, which may include a catalytic layer facing anode 520, such as catalytic carbon layer 532, and a second face, distal to catalytic layer 532, that may be juxtaposed against bridging current collector 534, and electrically associated therewith.

Depending on the particulars of construction, dye cell 500 may have a spacer layer or scatter layer 528 disposed between anode 520 and cathode 530. For example, when the cathode is printed onto the anode, it may be advantageous to apply (e.g., print) a spacer layer, such as spacer layer 528, between the anode and cathode, substantially as shown. In this configuration, catalytic layer 532 may be disposed opposite and along a broad face of spacer layer 528.

Dye cell 500 may be peripherally sealed by means of an edge or peripheral seal 545.

Generally, the plastic substrates (as well as any electrically conductive layers) used to cover the cathode may be opaque, for any of the methods described herein.

Figure 3:
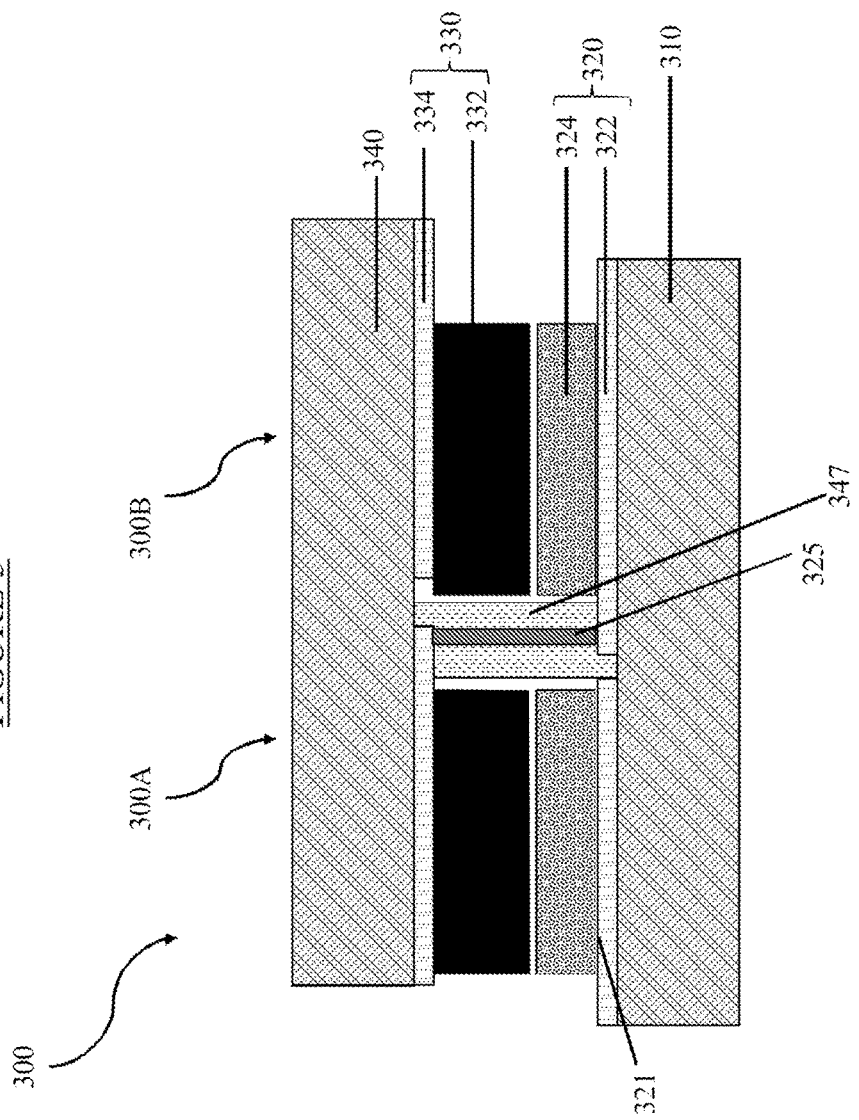
FIG. 3 provides a schematic view of an exemplary multiple dye cell arrangement according to one aspect of the present invention.

With reference now to FIG. 3, FIG. 3 provides a schematic view of an exemplary multiple dye cell arrangement 300 according to one aspect of the present invention (e.g., constructed in accordance with FIG. 2C, 2D). Arrangement 300 includes, by way of example, two plastic solar dye cells 300A, 300B. As in dye cell 100 shown in FIG. 1, dye cells 300A and 300B each include a sintered porous titania layer such as titania layer 324 and a conducting layer such as transparent conducting layer 322 (together forming an anode 320); a cathode 330, which may include an electrically conducting layer 334, and a catalytic layer such as catalytic carbon layer 332. The catalytic layer may be disposed opposite and along a broad face 319 (towards the center or the cathodic side of the cell, distal to broad face 321) of anode 320.

In the exemplary embodiment provided in FIG. 3, both a first (anode-side) cell wall such as plastic cell wall 310, and a second (cathode-side) cell wall such as plastic cell wall 340, may serve as the cell walls for at least two dye cells, and more typically, for a large plurality of such cells. Similarly, conducting layer 322 and conducting layer 334 may each be substantially continuous (e.g., ITO coatings on the plastic cell wall), with small breaks separating between adjacent cells.

Multiple cells may be electrically connected. In the exemplary embodiment provided in FIG. 3, plastic solar dye cells 300A and 300B are connected in series. Conducting layer 322 of anode 320 of cell 300B is physically and electrically connected to cathode 330 of cell 300A by means of structural conductive element 325, which may be disposed in generally perpendicular fashion with respect to conducting layers 332 and 322. Between adjacent dye cells may be disposed a sealing barrier 347, which may further serve to isolate conductive element 325 from the corrosive materials within each dye cell. Sealing barrier 347 may also serve to reduce ion migration between cells due to potential differences between cells (electrophoresis).

Depending on the particulars of construction, dye cells such as 300A and 300B may or may not have a spacer layer disposed between anode 320 and cathode 330.

An electrically conductive material (e.g., an electrically conductive paint) may be used to form conductive element 325, so as to electrically connect between adjacent cells. Exemplary materials may include silver paints, such as silver epoxy. Other exemplary materials may include adhesive materials containing conducting structures including tungsten or titanium metal or alloys, and/or titanium nitride (or other conductive nitrides), and/or conductive carbon such as carbon nanotubes. Many of the above-mentioned materials may reduce the risk of damage due to corrosion within the cell.

Laser scribing may be used, e.g., to provide ITO discontinuity between cells.

Figure 4:
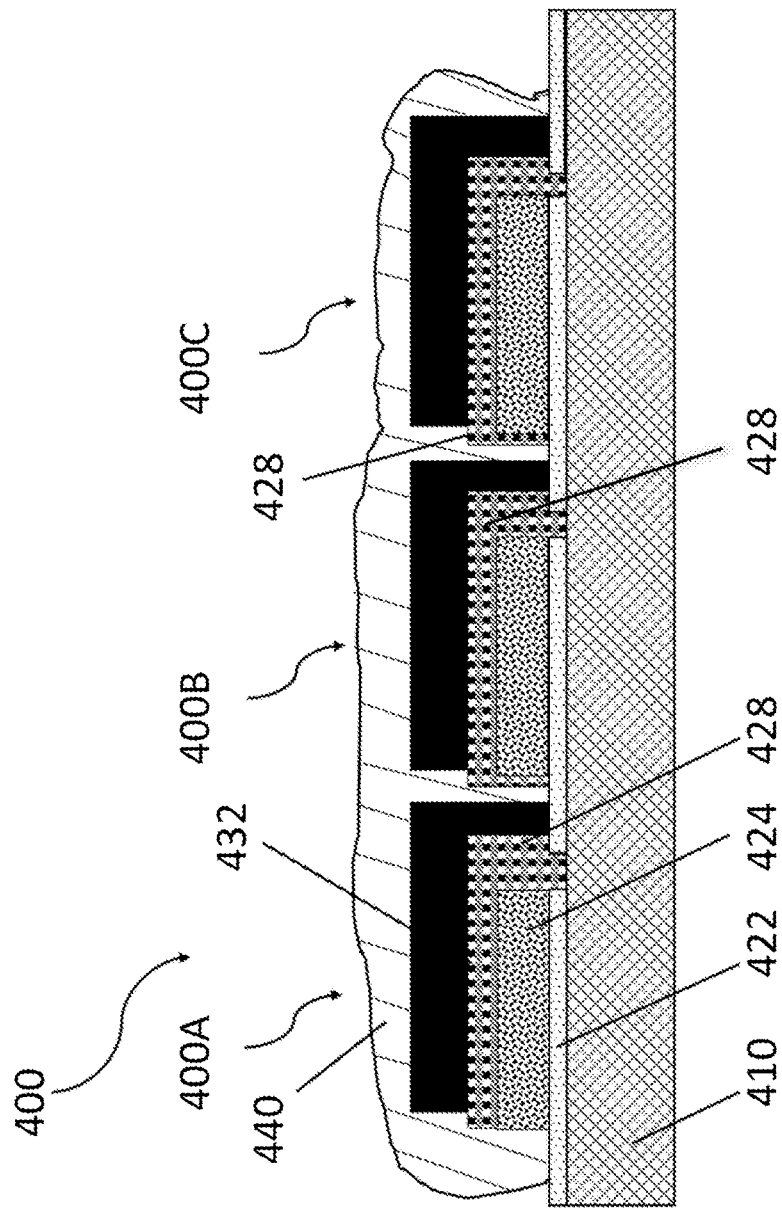
FIG. 4 provides a schematic view of an exemplary multiple dye cell arrangement according to other aspect of the present invention.

FIG. 4 provides a schematic view of an exemplary multiple dye cell arrangement 400 according to other aspect of the present invention (e.g., constructed in accordance with FIG. 2A, 2B). Arrangement 400 includes, by way of example, plastic solar dye cells 400A, 400B, and 400C. As in the dye cells provided hereinabove, dye cells 400A-C may each include a sintered porous titania layer such as titania layer 424 and a conducting layer such as transparent conducting layer 422 (together forming an anode); a cathode, which may include an electrically conducting layer 432 having a catalytic layer such as a catalytic carbon layer.

Depending on the particulars of construction, dye cells such as 400A-C may advantageously have a spacer layer disposed between the anode and cathode. For example, when the cathode is printed onto the anode, it may be advantageous to apply (e.g., print) a spacer layer, such as spacer layer 428, between the anode and cathode, substantially as shown. In this configuration, the catalytic layer may be disposed opposite and along a broad face of spacer layer 428.

The exemplary construction provided in FIG. 4 requires a single (conductive and transparent) plastic cell wall 412, disposed on the light-absorbing side of the cell. Perhaps more significantly, the need for a conductive (e.g., ITO) plastic on the distal (opaque) side of the cell is obviated. Electrical current may be collected via electrically conducting layer 432, which may include various types of conductive carbon.

In the exemplary embodiment provided in FIG. 4, plastic solar dye cells 400A-C are connected in series. Conducting layer 422 of the anode of cell 400B is physically and electrically connected to the cathode of cell 400A by means of electrically conducting layer 432, which may have a thick bridging section (or "appendage") in the intra-cellular region. Between adjacent dye cells, and above the cathodes, may be disposed a sealing barrier 440, which may form a cover layer for plastic solar dye cells 400A-C. This cover layer may be considered part of the housing of dye cells 400A-C, and of multiple dye cell arrangement 400.

Spacer layer 428 may be adapted to separate between titania layer 424 (or more generally, the anode) and prevent a short-circuit between the anode and electrically conducting layer 432, in the intra-cellular region as well.

As described hereinabove, the at least partially transparent electrically conducting layer such as conducting layer 422 may be substantially continuous (e.g., ITO coatings on plastic cell wall 410), with small breaks separating between adjacent cells, to enable multiple cells on a single plastic cell wall or substrate.

Figure 5A:
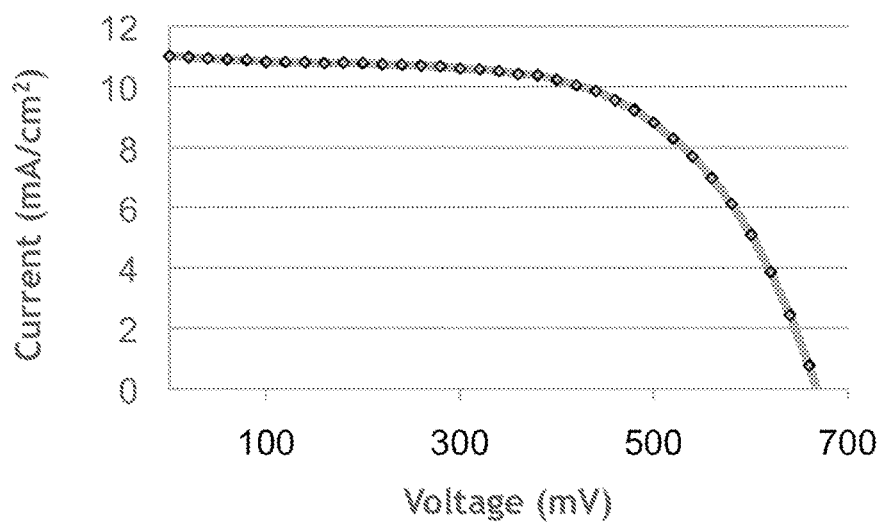
FIG. 5A provides an I-V curve for an all-plastic dye cell module using a dye cell arrangement as shown schematically in FIG. 5.

FIG. 5A provides an I-V curve showing a 4.4% efficiency under one sun illumination for an all-plastic dye cell module based on the quasi-monolithic design shown schematically in FIG. 5, assembled in accordance with the method of FIG. 2F. The cell had an active area of 2.7 cm$^2$.

Manufacturing Process

Figure 6:
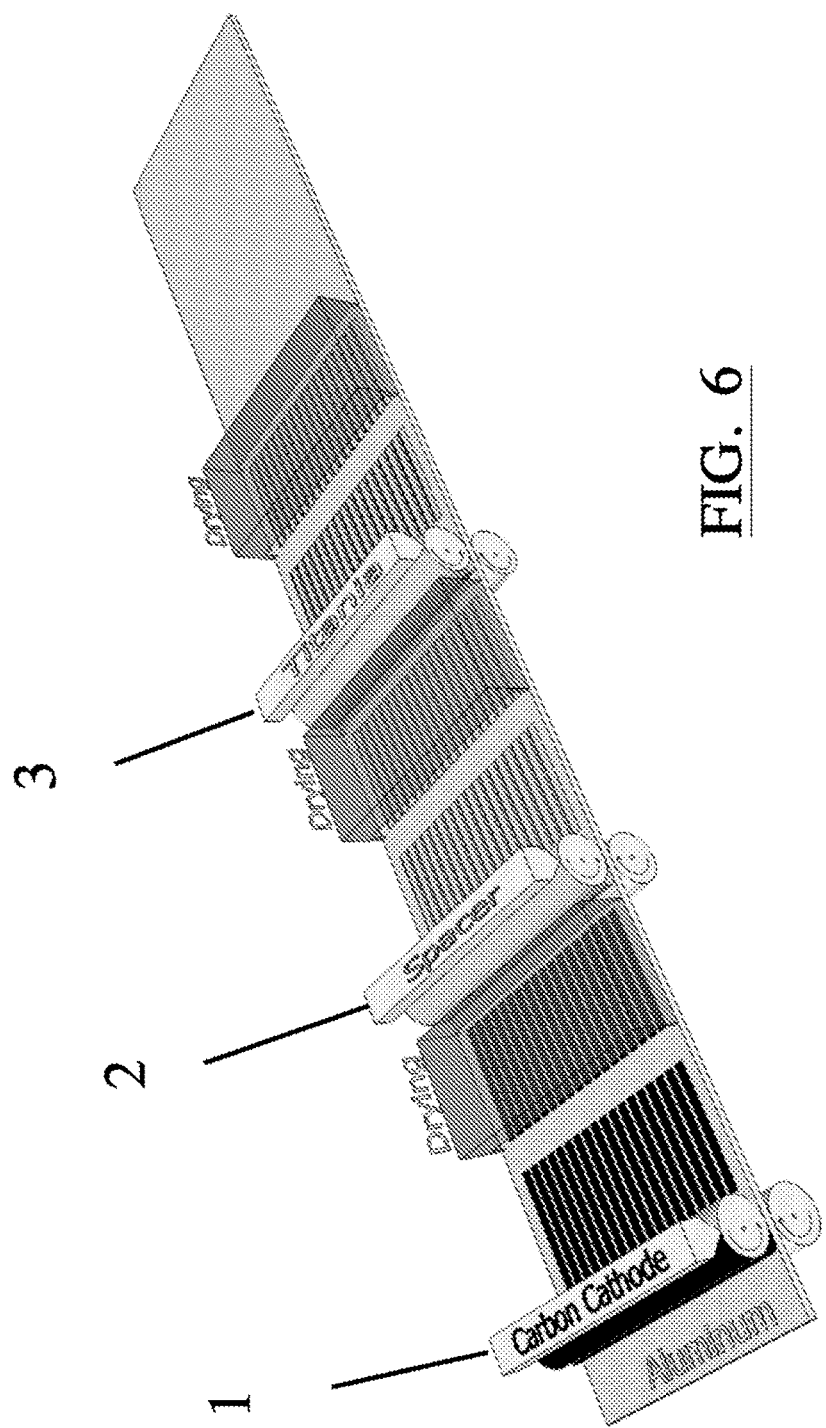
FIGS. 6 and 7 schematically depict embodiments of the present invention in which roll-to-roll processing is utilized to manufacture plastic solar cells.
Figure 7:
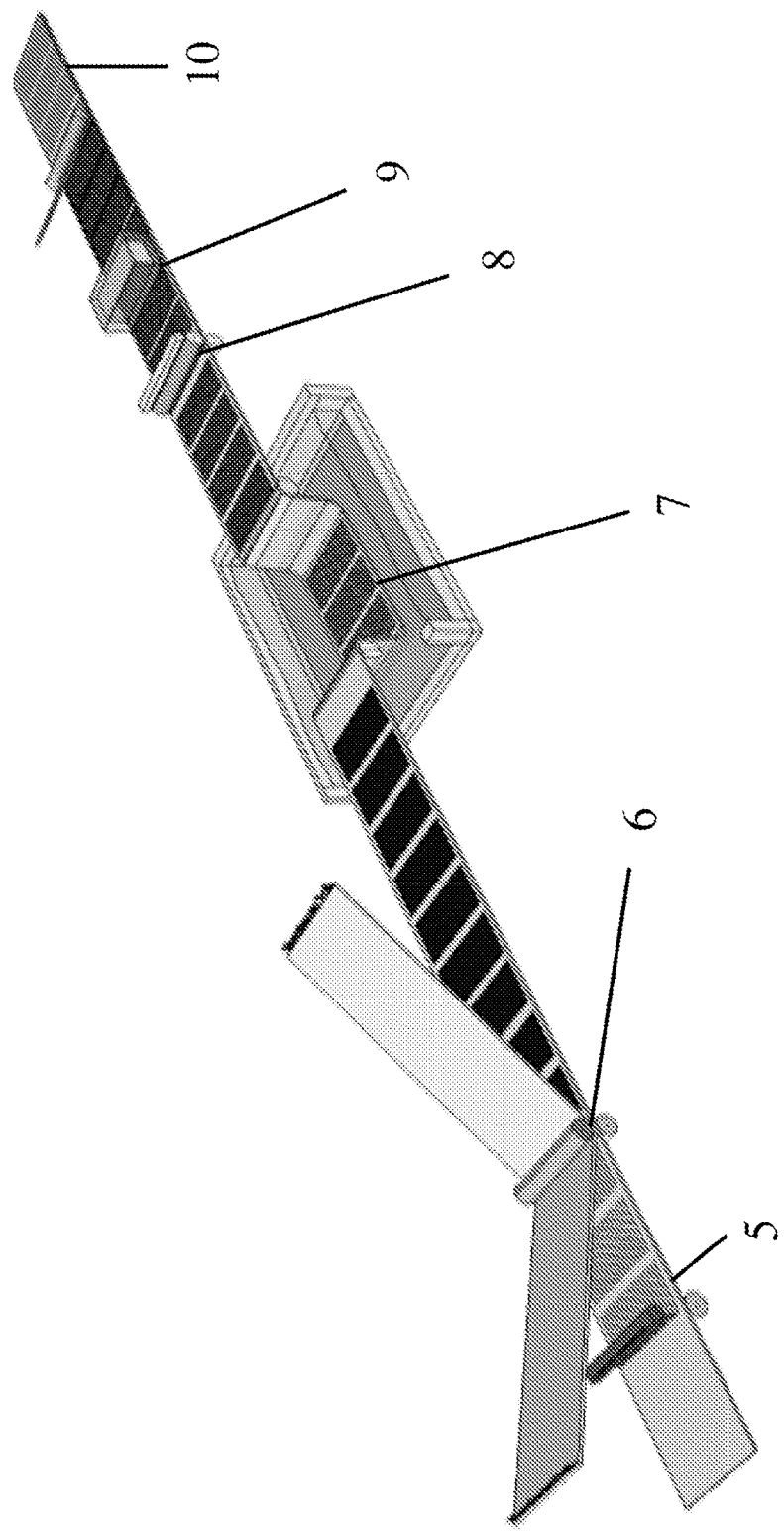

FIGS. 6 and 7 schematically depict exemplary embodiments of the present invention in which roll-to-roll processing is utilized to manufacture plastic solar cells.

By way of example, onto a smooth, metallic (e.g. aluminum, titanium, stainless steel) or graphite substrate foil support that is rollable, a high quality active titania layer is prepared by coating followed by high temperature sintering. This layer is then transferred to a conductive plastic sheet (e.g. ITO/PET) by juxtaposing the titania layer with the ITO surface and rolling between rollers (e.g., steel or stainless steel rollers, rollers covered by a rubber or polymeric layer, etc.), optionally followed by one or more optional pressing steps with the titania covered by a plastic sheet (e.g., a biaxially-oriented polyethylene terephthalate such as Mylar®).

Additional layers such as a titania scatter layer and a catalytic carbon layer can also be prepared on the substrate foil and transferred to the ITO/plastic foil or to the scatter/titania/ITO/plastic layer to make a PET/ITO/titania/scatter/cathode sandwich. Complete carbon/scatter/titania layers prepared on the substrate foil can also be transferred to the PET/ITO. Additionally, a titania or titania/scatter/carbon sandwich prepared on the substrate foil can be coated with ITO or FTO (for example, by spray pyrolysis of an ITO or an FTO precursor solution or printing/sintering of an ITO or an FTO paste) and then transferred to a plain PET carrier.

In the specific example shown schematically in FIG. 6, the between-rollers process is carried out in the following sequence:

step 1: cathode printing on the substrate foil, followed by drying;

step 2: insulator (spacer) printing on the substrate foil, followed by drying; and step 3: titania printing on the substrate foil, followed by drying.

Step 4, sintering (not shown) of the dye cell structure, may also be performed in a between-rollers process. Typically, the sintering step includes high-temperature sintering.

In the specific example shown schematically in FIG. 7, the between-rollers process may further include the following:

step 5: laser scribing of the transparent conductive layer (ITO) to produce the requisite discontinuities thereon;

step 6: transfer of the sintered dye cell structure to a conductive plastic cell wall (ITO/PET);

step 7: staining the sintered dye cell structure with dye;

step 8: electrolyte printing;

step 9. applying cell (and module) sealants to produce peripheral seals; and step 10: covering the modules with a cover film (e.g., plastic).

Subsequently, the modules may be separated.

As mentioned hereinabove, the roll-to-roll process associated with FIGS. 6 and 7 serves as one exemplary embodiment of the present invention. One of ordinary skill in the art will appreciate that other roll-to-roll manufacturing procedures may utilize various sequence, including those described in FIGS. 2A-F, as well as combinations thereof.

The transfer process may advantageously be naturally scalable, and suitable for roll-to-roll, high-throughput manufacturing, in accordance with the present invention.

The above-described process allows preparation of all-plastic dye cells (i.e., dye cells in which both the top and bottom walls of the cell are made of plastic) having high-efficiency, high-temperature sintered anodes.

The inventors believe that the inventive method and dye cell structure may be highly advantageous with respect to conventional plastic cells that utilize a titanium foil as one wall of the cell (on which the high-quality titania may be sintered directly). Such cells are costly because of the titanium foil and cannot be transparent (unlike dye cells of the present invention). The fact that such cells must be illuminated from the cathode side (with light loss on having to pass to the titania via a cathode and a dark electrolyte) means a low efficiency, typically only ~3%, which is approximately one half the efficiency that may be obtained with experimental dye cells of the present invention. Relative to a cell in which the illumination is direct (i.e., via the cell wall of the anode), such a configuration disadvantageously has a longer mean path for charge collection within the layer of titania, further detracting from cell efficiency.

It will be appreciated by those of ordinary skill in the art that many variations on the above procedures are possible (many of which are shown in the figures provided hereinabove), wherever possible maintaining applicability to roll-to-roll fabrication. More precise transfer may be attained by sandwiching the metal foil/conducting plastic element between two stainless steel foils prior to passing between rollers.

Alternatively or additionally, the rollers may be made of an alloy or metal (e.g., stainless steel, titanium, brass). As will be appreciated by those of ordinary skill in the art, the rollers may be uncoated or coated (e.g., with rubber, various plastics). The rollers may be made of a rubber or a plastic, or of other materials known to those of skill in the art.

The transfer onto plastic or conducting plastic from the substrate or carrier foil pertains not only to sintered titania. For example, sintered or coated carbon or platinum, or complete, multiple-layered titania/cathode sandwiches may also be transferred by this technique.

The titania layers may be single or multiple layers, and may incorporate various titania scatter and blocking layers known in the art. Complete titania/cathode sandwiches may also be transferred in a reverse orientation such that the cathode side mates with the plain or electrically conductive plastic surface. Transfer may be made onto plain plastic or onto conductive plastic having selected areas of conducting surface removed by patterning (this latter enables fabrication of series connected dye cells on a single substrate). Dye tandems can be built up by successive transfer of titania layers with different dyes having complementary spectral response applied before or after layer transfer.

As used herein in the specification and in the claims section that follows, the term "on top of" includes, but is not limited to "directly on top of, and physically attached to".

As used herein in the specification and in the claims section that follows, the term "largely includes", and the like, with respect to a component within a formulation, refers to a weight content of at least 30%; the term "mostly includes", and the like, with respect to a component within a formulation, refers to a weight content of at least 50%; the term "predominantly includes", and the like, with respect to a component within a formulation, refers to a weight content of at least 75%; the term "substantially includes", and the like, with respect to a component within a formulation, refers to a weight content of at least 90%.

As used herein in the specification and in the claims section that follows, the term "dye cell structure" is meant to include various portions of a solar dye cell, the portions having one or more layers. The term "dye cell structure" is further meant to include one or more layers that have yet to undergo drying or sintering, e.g., a nanoparticulate titania paste, a carbon paste, or a spacer layer paste.

It will be appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. A photovoltaic dye cell arrangement comprising:
at least one photovoltaic dye cell, each having:
(a) a cell housing, said housing including an at least partially transparent cell wall along a first broad face of said housing;
(b) an at least partially transparent electrically conductive layer disposed on a first interior surface of said cell wall, within the photovoltaic cell, said interior surface made of a plastic;
(c) an anode disposed on said at least partially transparent electrically conductive layer, in distal fashion with respect to said first interior surface, said anode including:
(i) a porous film having a porous film surface, said porous film surface disposed above, and electrically communicating with, a broad face of said electrically conductive layer, and adapted to make intimate contact with an electrolyte including a redox charge transfer species, said porous film including a plurality of nanoparticles and
(ii) a dye, disposed on a nanoparticle surface of said nanoparticles, said dye and said porous film adapted to convert photons to electrons, by means of said redox charge transfer species; and
(d) a cathode disposed against a second interior surface on a second broad face of said housing, distal to said first broad face of said housing, and substantially opposite and above said anode, said cathode including a catalytic surface disposed to fluidly contact said electrolyte,
wherein said porous film is a high-temperature sintered porous film containing high-temperature sintered titania; and
wherein said high-temperature sintered titania of said high-temperature sintered porous film surface directly contacts said broad face of said electrically conductive layer, and fixedly adheres thereto.

2. The dye cell arrangement of claim 1, said second interior surface made of plastic.

3. The dye cell arrangement of claim 1, said first and second broad faces of said housing consisting of plastic.

4. The dye cell arrangement of claim 1, said at least one photovoltaic dye cell including a plurality of dye cells, said cell housing containing said plurality of dye cells, said at least partially transparent cell wall being a single, common at least partially transparent cell wall shared by said plurality of dye cells.

5. The dye cell arrangement of claim 4, said plurality of dye cells electrically connected in series by at least one intercell electrical connection, said at least one intercell electrical connection physically connecting between said cathode of a first dye cell of said plurality of dye cells, and said anode of a second dye cell of said plurality of dye cells.

6. The dye cell arrangement of claim 5, at least one intercell electrical connection being physically sealed from said electrolyte disposed within said dye cells by a polymer sealant that radially envelops said at least one intercell electrical connection.

7. The dye cell arrangement of claim 1, said cell wall being a flexible cell wall, said flexible cell wall being sufficiently flexible to be used in a roll-to-roll transfer process.

8. A method of producing a photovoltaic dye cell arrangement, the method comprising:
(a) providing a flexible intermediate substrate;
(b) applying, on a surface of said flexible intermediate substrate, a layer of paste containing titania particles, to form a first structure contacting said surface;
(c) subjecting said first structure to sintering at a temperature of at least 370° C. to produce a sintered structure including a high-temperature sintered titania layer;
(d) transferring said sintered structure from said surface of said flexible intermediate substrate, between rollers, to a flexible plastic substrate; and
(e) fixedly adhering said sintered structure to said flexible plastic substrate to form the photovoltaic dye cell arrangement of claim 1.

9. The method of claim 8, said fixedly adhering includes at least one mechanical pressing operation.

10. The method of claim 8, wherein said surface of said flexible intermediate substrate is repeatably durable to said sintering.

11. The method of claim 8, further comprising repeating steps (b)-(d) at least 50 times, using said surface of a single, particular substrate of said flexible intermediate substrate.

12. The method of claim 8, further comprising: prior to step (c), drying said layer of paste, and applying a titania scattering layer on top of said titania particles.

13. The method of claim 12, further comprising: laying down an integral cathode on top of said titania scattering layer.

14. The method of claim 8, wherein at least one of steps (b) to (e) is performed on a moving belt.

15. The method of claim 8, wherein a roll of said flexible intermediate substrate is utilized in step (a).

16. The method of claim 8, further comprising rolling up an adhered sintered structure produced in step (e) to form a roll of the photovoltaic dye cell arrangement.

17. The method of claim 8, wherein said surface of said flexible intermediate substrate includes a material selected from the group consisting of graphite, aluminum, stainless steel, and titanium.

18. The method of claim 8, wherein said transferring of said sintered structure from said surface of said flexible intermediate substrate includes peeling off said sintered structure from said surface.

19. A photovoltaic dye cell arrangement comprising:
at least one photovoltaic dye cell, each having:

(a) a cell housing, said housing including an at least partially transparent cell wall along a first broad face of said housing;
(b) an at least partially transparent electrically conductive layer disposed on a first interior surface of said cell wall, within the photovoltaic cell, said at least partially transparent electrically conductive layer consisting of doped tin oxide, said interior surface made of a plastic;
(c) an anode disposed on said at least partially transparent electrically conductive layer, in distal fashion with respect to said first interior surface, said anode including:
  (i) a porous film having a porous film surface, said porous film surface disposed above, and electrically communicating with, a broad face of said electrically conductive layer, and adapted to make intimate contact with an electrolyte including a redox charge transfer species, said porous film including a plurality of nanoparticles and
  (ii) a dye, disposed on a nanoparticle surface of said nanoparticles, said dye and said porous film adapted to convert photons to electrons, by means of said redox charge transfer species; and
(d) a cathode disposed against a second interior surface on a second broad face of said housing, distal to said first broad face of said housing, and substantially opposite and above said anode, said cathode including a catalytic surface disposed to fluidly contact said electrolyte,
wherein said porous film surface is a high-temperature sintered porous film surface containing high-temperature sintered titania; and
wherein said high-temperature sintered porous film surface directly contacts said doped tin oxide, and fixedly adheres thereto.

20. A photovoltaic dye cell arrangement comprising:
at least one photovoltaic dye cell, each having:

(a) a cell housing, said housing including an at least partially transparent cell wall along a first broad face of said housing;
(b) an at least partially transparent electrically conductive layer disposed on a first interior surface of said cell wall, within the photovoltaic cell, said at least partially transparent electrically conductive layer including a layer of doped tin oxide, said interior surface made of a plastic;
(c) an anode disposed on said at least partially transparent electrically conductive layer, in distal fashion with respect to said first interior surface, said anode including:
  (i) a porous film having a porous film surface, said porous film surface disposed above, and electrically communicating with, a broad face of said electrically conductive layer, and adapted to make intimate contact with an electrolyte including a redox charge transfer species, said porous film including a plurality of nanoparticles and
  (ii) a dye, disposed on a nanoparticle surface of said nanoparticles, said dye and said porous film adapted to convert photons to electrons, by means of said redox charge transfer species; and
(d) a cathode disposed against a second interior surface on a second broad face of said housing, distal to said first broad face of said housing, and substantially opposite and above said anode, said cathode including a catalytic surface disposed to fluidly contact said electrolyte,
wherein said porous film surface is a high-temperature sintered porous film surface containing high-temperature sintered titania; and
wherein said high-temperature sintered porous film surface directly contacts said layer of doped tin oxide, and fixedly adheres thereto.

* * * * *